(12) United States Patent
Yamada

(10) Patent No.: US 12,040,027 B2
(45) Date of Patent: Jul. 16, 2024

(54) MEMORY SYSTEM, MEMORY CONTROLLER, AND SEMICONDUCTOR STORAGE DEVICE

(71) Applicant: KIOXIA CORPORATION, Tokyo (JP)

(72) Inventor: Junji Yamada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 322 days.

(21) Appl. No.: 17/679,761

(22) Filed: Feb. 24, 2022

(65) Prior Publication Data

US 2022/0415411 A1 Dec. 29, 2022

(30) Foreign Application Priority Data

Jun. 25, 2021 (JP) ................. 2021-106100

(51) Int. Cl.
*G11C 16/04* (2006.01)
*G11C 16/34* (2006.01)

(52) U.S. Cl.
CPC ...... *G11C 16/3431* (2013.01); *G11C 16/0483* (2013.01)

(58) Field of Classification Search
CPC .......... G11C 16/3431; G11C 16/0483
USPC .................................... 365/185.02
See application file for complete search history.

(56) References Cited

U.S. PATENT DOCUMENTS

| 2004/0218458 | A1* | 11/2004 | Schneider ......... G11C 11/40626 365/232 |
| 2017/0148494 | A1 | 5/2017 | Pan et al. |
| 2018/0076816 | A1 | 3/2018 | Matsuzaki |
| 2018/0197599 | A1 | 7/2018 | Choi et al. |
| 2020/0098421 | A1* | 3/2020 | Alsasua ............. G11C 16/3418 |
| 2020/0301602 | A1 | 9/2020 | Kurosawa |

FOREIGN PATENT DOCUMENTS

| JP | 2020-155167 A | 9/2020 |
| TW | 201729207 A | 8/2017 |
| TW | 201825874 A | 7/2018 |
| TW | 201826270 A | 7/2018 |

* cited by examiner

*Primary Examiner* — Vu A Le
(74) *Attorney, Agent, or Firm* — Kim & Stewart LLP

(57) ABSTRACT

A memory system includes: a semiconductor storage device including a memory cell array that includes memory cells and a temperature counter configured to increase a count value thereof at a rate that depends on a temperature of the memory cell array; and a memory controller configured to acquire the count value from the semiconductor storage device and reserve a refresh operation for a written memory cell of the memory cell array when a cumulative value of the count value, which is accumulated from when data was written to the memory cell to when the count value is acquired, exceeds a predetermined value.

20 Claims, 13 Drawing Sheets

FIG. 6

| WORD LINE NUMBER | CUMULATIVE COUNT VALUE | WRITTEN FLAG |
|---|---|---|
| 0 | 2000 | True |
| 1 | 2355 | True |
| 2 | 4336 | True |
| 3 | 2111 | True |
| 4 | 2000 | True |
| 5 | 335669 | True |
| 6 | 2355 | True |
| 7 | 4336 | True |
| 8 | 2111 | True |
| 9 | 2000 | True |
| 10 | 335669 | True |
| 11 | −1 | False |
| 12 | −1 | False |
| 13 | −1 | False |
| 14 | −1 | False |
| 15 | −1 | False |

FIG. 14

| TEMPERATURE CODE (TEMPCODE) | ADDITION VALUE |
|---|---|
| 20 | 1 |
| 30 | 1 |
| 40 | 1 |
| 50 | 1 |
| 60 | 2 |
| 70 | 4 |
| 80 | 8 |
| 90 | 16 |
| 100 | 32 |
| 110 | 128 |
| 120 | 256 |

MEMORY SYSTEM, MEMORY CONTROLLER, AND SEMICONDUCTOR STORAGE DEVICE

CROSS-REFERENCE TO RELATED APPLICATION

This application is based upon and claims the benefit of priority from Japanese Patent Application No. 2021-106100, filed Jun. 25, 2021, the entire contents of which are incorporated herein by reference.

FIELD

Embodiments described herein relate generally to a memory system, a memory controller, and a semiconductor storage device.

BACKGROUND

A memory system including a NAND flash memory as a semiconductor storage device and a memory controller for controlling the semiconductor storage device is known.

DESCRIPTION OF THE DRAWINGS

FIG. 6 is a conceptual view of a cumulative count value table in the memory system according to the first embodiment.

FIG. 14 is a conceptual view of an addition value table in the memory system according to the second embodiment.

DETAILED DESCRIPTION

Figure 1:
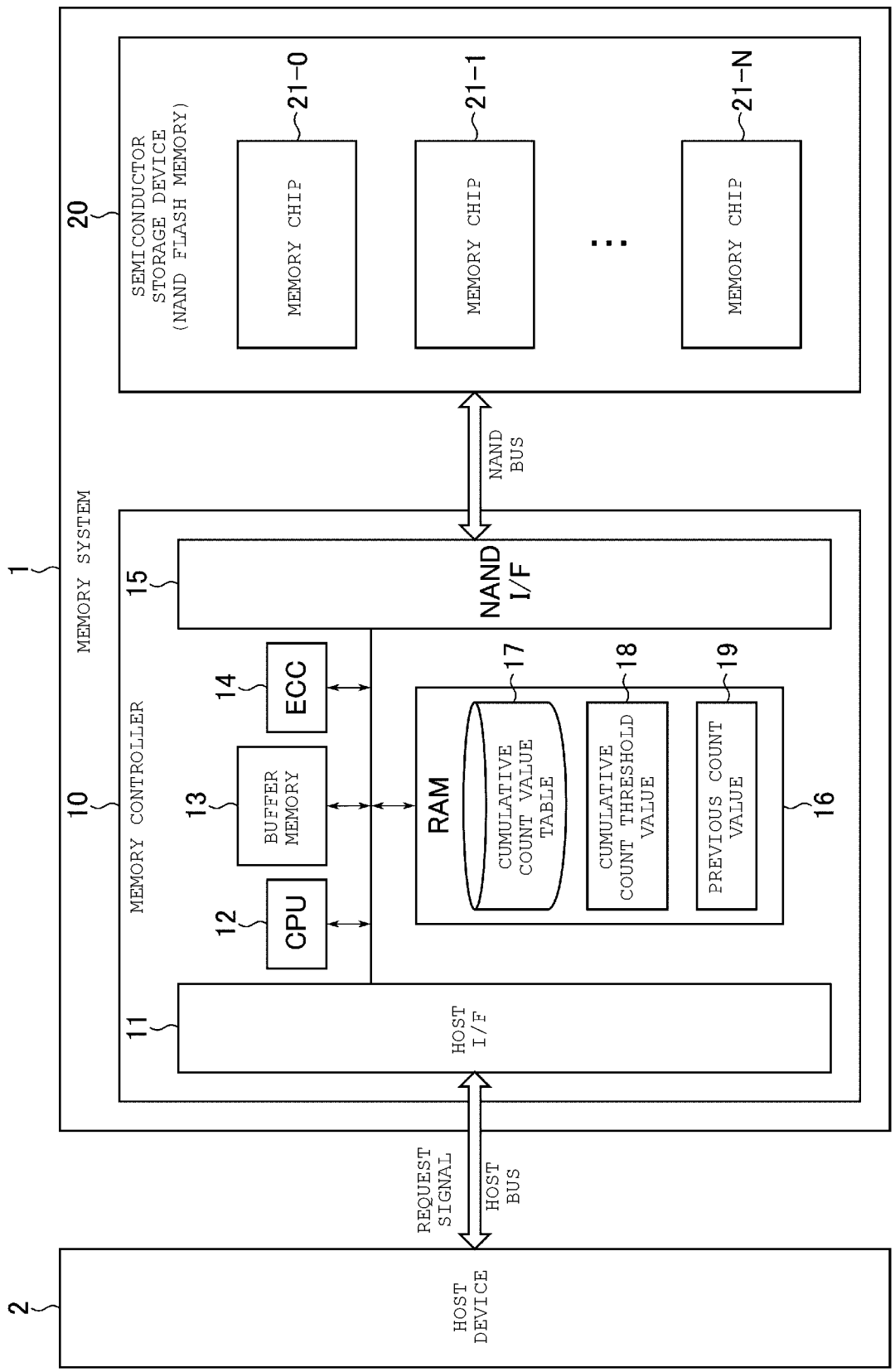
FIG. 1 is a block view of a memory system according to a first embodiment.

Embodiments provide a memory system, a memory controller, and a semiconductor storage device capable of improving the reliability of stored data.

In general, according to one embodiment, a memory system includes: a semiconductor storage device including a memory cell array that includes memory cells and a temperature counter configured to increase a count value thereof at a rate that depends on a temperature of the memory cell array; and a memory controller configured to acquire the count value from the semiconductor storage device and reserve a refresh operation for a written memory cell of the memory cell array when a cumulative value of the count value, which is accumulated from when data was written to the memory cell to when the count value is acquired, exceeds a predetermined value.

Hereinafter, embodiments will be described with reference to the drawings. In this explanation, common reference numerals are given to common portions throughout the drawings.

[1] First Embodiment

A memory system according to a first embodiment will be described. In the following, a memory system including a NAND flash memory as a semiconductor storage device will be described as an example.

[1-1] Configuration

[1-1-1] Overall Configuration of Memory System

The overall configuration of the memory system according to the present embodiment will be described with reference to FIG. 1. FIG. 1 is a block view of the memory system according to the present embodiment.

The memory system 1 includes a memory controller 10 and a NAND flash memory 20. The memory system 1 is controlled by a host device 2. The memory system 1 performs a process based on a request signal received from the host device 2. The memory system 1 is, for example, a storage device such as a solid state drive (SSD), a universal serial bus (USB) memory, a memory device such as a multi-media card (MMC), or a memory card. The host device 2 is, for example, a digital camera or a personal computer.

The memory controller 10 receives the request signal from the host device 2 via a host bus. The type of host bus depends on a type of the memory system 1. When the memory system 1 is an SSD, a serial interface such as a serial attached SCSI (SAS) or a serial ATA (SATA) or a universal flash storage (UFS) standard interface is used, for example, as the host bus. When the memory system 1 is a USB memory, a USB is used as the host bus. When the memory system 1 is an MMC, an embedded multimedia card (eMMC) standard interface is used as the host bus. When the memory system 1 is a memory card, an interface of a standard suitable for the memory card is used as the host bus.

The memory controller 10 controls the NAND flash memory 20 via a NAND bus based on the request signal received from the host device 2. The NAND bus performs communication of signals according to a NAND interface.

The memory controller 10 includes a host interface circuit 11, a processor (CPU: Central Processing Unit) 12, a buffer memory 13, an error checking and correcting (ECC) circuit 14, a NAND interface circuit 15, and a random access memory (RAM) 16.

The host interface circuit 11 is connected to the host device 2 via the host bus. The host interface circuit 11 controls communication between the memory controller 10 and the host device 2.

The processor 12 controls an operation of the entire memory controller 10 using a program stored in a read only memory (ROM) (not shown) in the memory controller 10. For example, when the processor 12 receives a write request from the host device 2, the processor 12 controls a write operation based on the write request. The same applies to a read operation and the erasing operation. Further, the processor 12 executes a refresh operation, a refresh reservation control operation, and a refresh control operation. For example, data stored in a certain storage area in the NAND flash memory 20 may deteriorate over time. More specifically, threshold voltage distributions of the memory cell transistors in a certain storage area may deteriorate when a long period of time elapses after a write operation has been executed. When data stored in a certain storage area in the NAND flash memory 20 deteriorates, the data may be read from the certain storage area, subject to an error correction process and then be written into a new storage area after executing an error correction process to thereby reduce the number of errors (the number of error bits) included in the data due to the deterioration. A series of operations of reading data from a certain storage area in the NAND flash memory 20, executing an error correction process to the read data, and writing the error-corrected data to a new storage area may be referred to as a refresh operation. Alternatively, if a deterioration of data is insignificant, a series of operations of reading data from a certain storage area in the NAND flash memory 20, executing an error correction process to the read data, and executing a write operation to the same storage area may be performed as a refresh operation. The refresh reservation control operation is an operation of controlling the reservation of the refresh operation. The refresh control operation is an operation of controlling the execution of the refresh operation.

The buffer memory 13 is, for example, a static random access memory (SRAM). The buffer memory 13 temporarily stores data read from the NAND flash memory 20 by the memory controller 10, write data received by the memory controller 10 from the host device 2, and the like.

The ECC circuit 14 performs an error detection process and an error correction process related to the data stored in the NAND flash memory 20. That is, the ECC circuit 14 generates an error correction code when performing a write operation of the data and assigns the generated code to the write data. The ECC circuit 14 decodes the error correction code when performing a read operation of the data and detects the presence or absence of an error bit. When the error bit is detected, the ECC circuit 14 determines an error location of the error bit and corrects the error.

The NAND interface circuit 15 is connected to the NAND flash memory 20 via the NAND bus. The NAND interface circuit 15 controls communication between the memory controller 10 and the NAND flash memory 20. For example, the NAND interface circuit 15 controls transfer of data, commands, and addresses between the memory controller 10 and the NAND flash memory 20.

The RAM 16 is, for example, an SRAM. The RAM 16 is used as a work area of the processor 12. The RAM 16 stores firmware for managing the NAND flash memory 20 or various management information. The RAM 16 stores, for example, a cumulative count value table 17, a cumulative count threshold value 18, and a previous count value 19 as information used for the refresh reservation control operation.

The cumulative count value table 17 is a table that stores the cumulative count value. The count value is a value corresponding to the temperature history of the NAND flash memory 20. The cumulative count value is a value indicating the accumulation (increase amount) of the count value, which is accumulated from when the data is written to a target memory area in the NAND flash memory 20 to when the count value is acquired by the memory controller 10. The details of the cumulative count value table 17 will be described later. The cumulative count threshold value 18 is a threshold value for determining whether or not to reserve the refresh operation by comparing with the cumulative count value in the cumulative count value table 17. The previous count value 19 is a count value acquired previously by the memory controller 10.

The cumulative count value table 17, the cumulative count threshold value 18, and the previous count value 19 are stored in, for example, any block BLK of the NAND flash memory 20. The cumulative count value table 17, the cumulative count threshold value 18, and the previous count value 19 are loaded from the NAND flash memory 20 into the RAM 16, for example, immediately after the power is turned on. Further, the cumulative count value table 17, the cumulative count threshold value 18, and the previous count value 19 are updated, for example, when performing the refresh reservation control operation.

The NAND flash memory 20 stores the data received from the memory controller 10 in a nonvolatile manner. The NAND flash memory 20 outputs the read data to the memory controller 10. The NAND flash memory 20 includes a plurality of memory chips 21 (21-0 to 21-N (N is an integer of 1 or more)). Each of the memory chips 21-0 to 21-N is independently controlled by the memory controller 10. The number of memory chips 21 in the NAND flash memory 20 may be one.

[1-1-2] Configuration of Memory Chips 21

Figure 2:
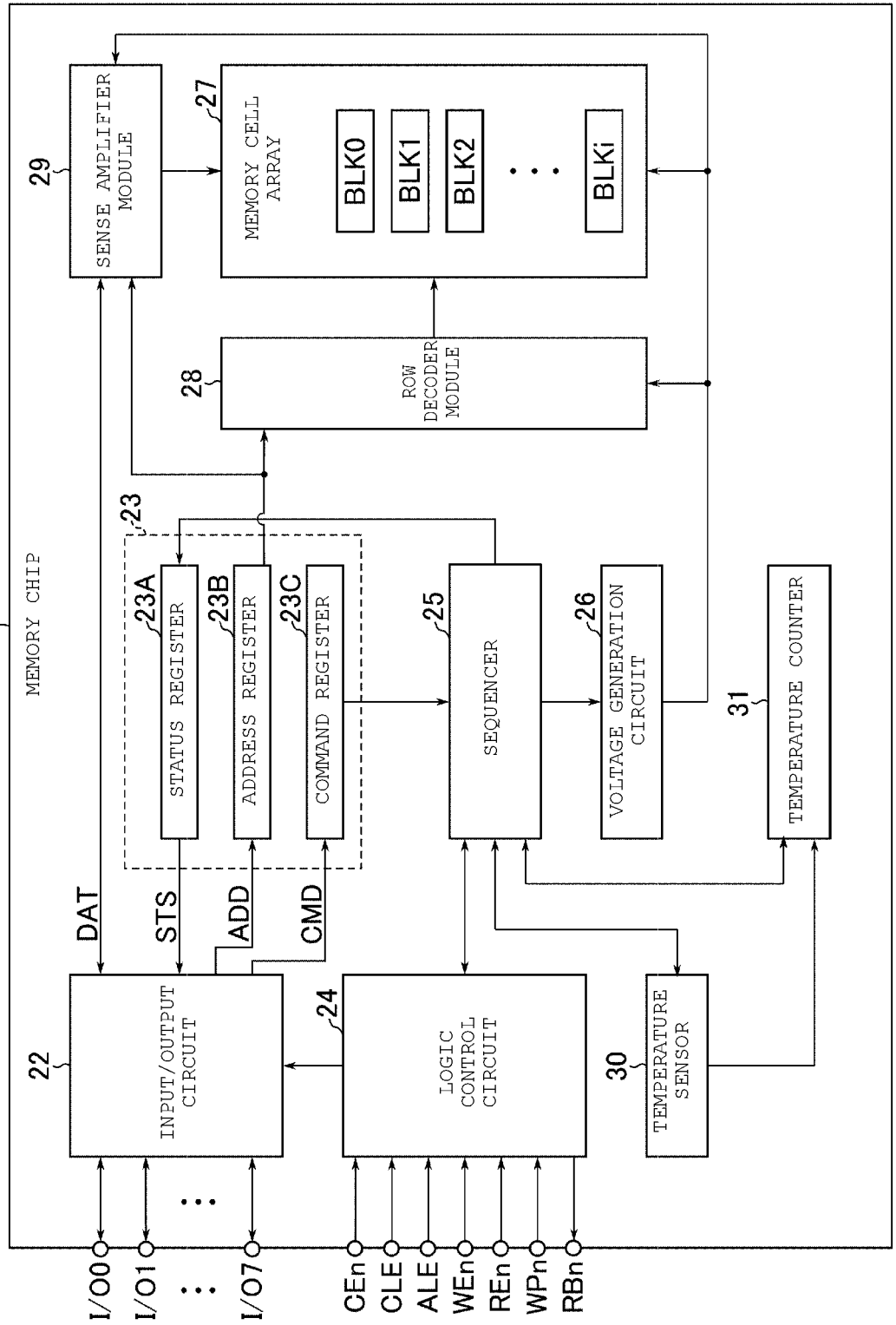
FIG. 2 is a block view showing an example of a configuration of a memory chip in a semiconductor storage device in the memory system according to the first embodiment.

The configuration of the memory chips (hereinafter, simply referred to as "chips") 21 in the NAND flash memory 20 will be described with reference to FIG. 2. FIG. 2 is a block view showing an example of a configuration of a chip 21-0 in the NAND flash memory 20 in the memory system 1 according to the present embodiment. Since the chips 21-1 to 21-N have the same configuration as the chip 21-0, the description thereof will be omitted.

The chip 21-0 includes, for example, an input/output circuit 22, a register set 23, a logic control circuit 24, a sequencer 25, a voltage generation circuit 26, a memory cell array 27, a row decoder module 28, a sense amplifier module 29, and a temperature sensor 30, and a temperature counter 31.

8-bit wide input/output signals I/O0 to I/O7 are communicated between the memory controller 10 and the input/output circuit 22. The input/output signal I/O includes, for example, data DAT, a status STS, an address ADD, a command CMD, and the like. The data DAT is communicated between the sense amplifier module 29 and the input/output circuit 22.

The register set 23 includes a status register 23A, an address register 23B, and a command register 23C. The status register 23A stores the status STS. The address register 23B stores the address ADD. The command register 23C stores the command CMD.

The status STS is updated based on, for example, an operating state of the sequencer 25. The status STS is transferred from the status register 23A to the input/output circuit 22 based on an instruction from the memory controller 10 and is output to the memory controller 10. The address ADD is transferred from the input/output circuit 22 to the address register 23B. The address ADD includes, for example, a chip address, a block address, a page address, a column address, and the like. The command CMD is transferred from the input/output circuit 22 to the command register 23C. The command CMD includes, for example, instructions related to various operations of the chip 21-0.

The logic control circuit 24 controls each of the input/output circuit 22 and the sequencer 25 based on control signals received from the memory controller 10. As such control signals, for example, a chip enable signal CEn, a command latch enable signal CLE, an address latch enable signal ALE, a write enable signal WEn, a read enable signal REn, and a write protect signal WPn are used. Further, the logic control circuit 24 notifies the memory controller 10 of the control signal received from the sequencer 25. As such a control signal, for example, a ready/busy signal RBn is used.

The chip enable signal CEn is a signal for enabling the chip 21-0. The command latch enable signal CLE is a signal for notifying the input/output circuit 22 that the received input/output signal I/O is a command CMD. The address latch enable signal ALE is a signal for notifying the input/output circuit 22 that the received input/output signal I/O is the address ADD. The write enable signal WEn is a signal for instructing the input/output circuit 22 to input the input/output signal I/O. The read enable signal REn is a signal for instructing the input/output circuit 22 to output the input/output signal I/O. The write protect signal WPn is a signal for putting the chip 21-0 in a write-protected state when the power is turned on and off.

The ready/busy signal RBn is a signal for notifying the memory controller 10 whether the chip 21-0 is in a ready state or a busy state. In the present specification, the "ready state" indicates that the chip 21-0 is in a state in which the chip 21-0 can receive an instruction from the memory controller 10. On the other hand, the "busy state" indicates that the chip 21-0 is in a state in which the chip 21-0 cannot receive an instruction from the memory controller 10.

The sequencer 25 controls the operation of the entire chip 21-0. For example, the sequencer 25 executes the read operation, the write operation, the erasing operation, and the like based on the command CMD stored in the command register 23C and the address ADD stored in the address register 23B. Further, the sequencer 25 controls a temperature sensor 30 and the temperature counter 31. The sequencer 25 stores, for example, a voltage value, which is based on the temperature acquired from the temperature sensor 30, and a count value, which is acquired from the temperature counter 31, in the status register 23A as the status STS, and outputs the status STS to the memory controller 10 via the input/output circuit 22. The voltage value and the count value based on the temperature may be output to the memory controller 10 as information other than the status STS.

The voltage generation circuit 26 generates a voltage used in the read operation, the write operation, the erasing operation, and the like. The voltage generation circuit 26 supplies the generated voltage to the memory cell array 27, the row decoder module 28, and the sense amplifier module 29.

The memory cell array 27 includes a plurality of blocks BLK0 to BLKi (i is an integer of 1 or more). The block BLK is a set of a plurality of memory cell transistors (hereinafter, may be referred to as "memory cells"), and is used, for example, as an erasing unit of the data. Each memory cell transistor is associated with one bit line and one word line.

The row decoder module 28 selects the block BLK based on the block address. The row decoder module 28 transfers the voltage supplied from the voltage generation circuit 26 to the word line or the like in the selected block BLK.

In the read operation, the sense amplifier module 29 reads the data from the memory cell array 27 and transfers the read data to the input/output circuit 22. In the write operation, the sense amplifier module 29 applies a predetermined voltage to the bit line based on the data received from the input/output circuit 22.

The temperature sensor 30 measures, for example, the temperature of the memory cell array 27. The temperature sensor 30 supplies the voltage based on the measured temperature to the sequencer 25 and the temperature counter 31. The temperature sensor 30 does not have to directly measure the temperature of the memory cell array 27. For example, the temperature sensor 30 may measure the temperature of a portion other than the memory cell array 27 in the chip 21-0.

The temperature counter 31 changes a period (rate) of a count-up (update of the count value) based on the voltage supplied from the temperature sensor 30. For example, the temperature counter 31 increases the rate of the count-up as the voltage supplied from the temperature sensor 30 increases. The temperature counter 31 transmits the count value to the sequencer 25. Details of the operation of the temperature counter 31 will be described later.

[1-1-3] Configuration of Circuit of Memory Cell Array 27

Figure 3:
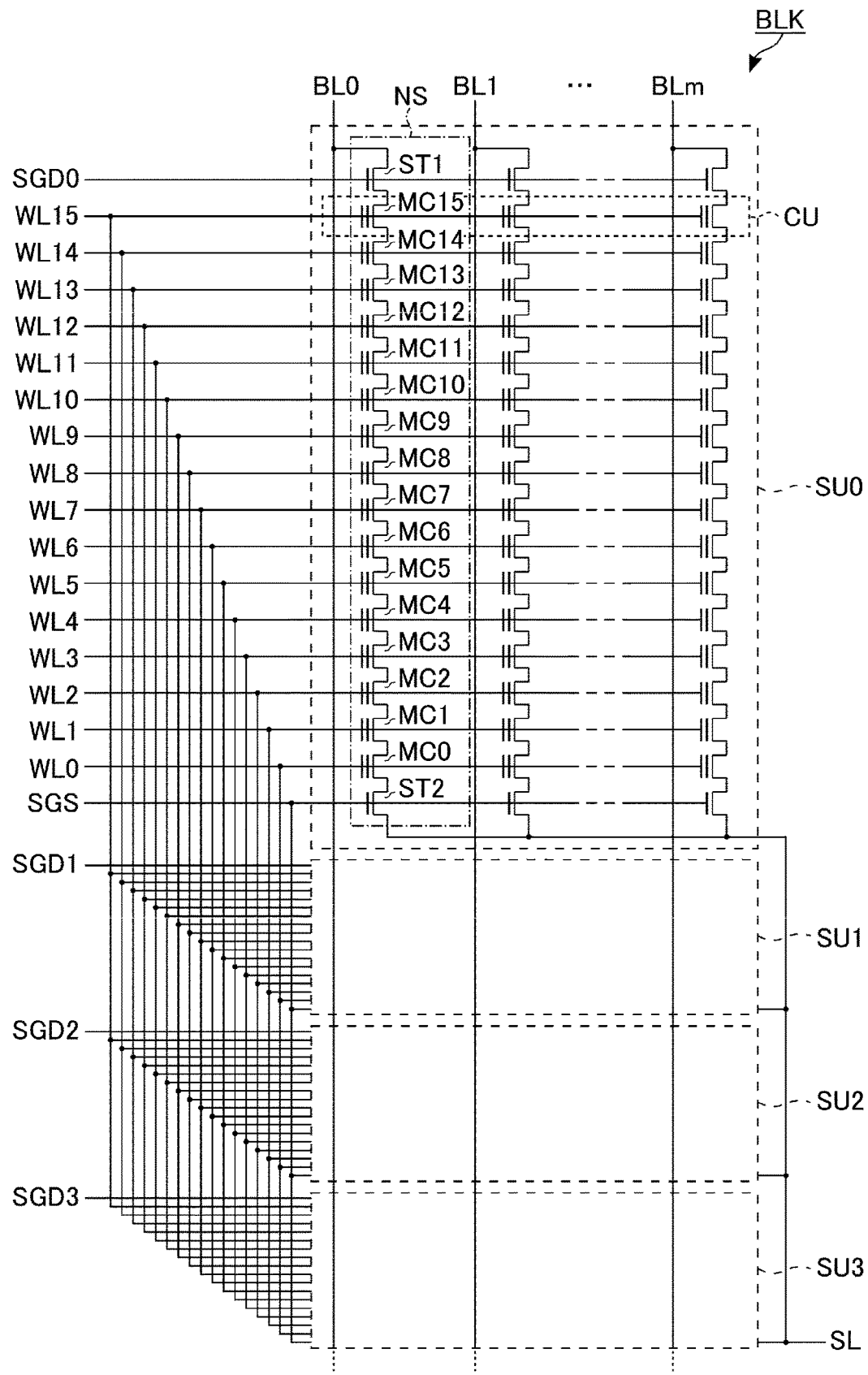
FIG. 3 is a circuit view of a memory cell array in a memory chip in the memory system according to the first embodiment.

The configuration of a circuit of the memory cell array 27 in the chips 21 will be described with reference to FIG. 3. FIG. 3 is a circuit view of a memory cell array 27 in the chips 21 disposed in the memory system 1 according to the present embodiment. FIG. 3 shows an example of the configuration of the circuit of the memory cell array 27 by extracting one block BLK from the plurality of blocks BLK in the memory cell array 27. The other blocks BLK also have the configuration shown in FIG. 3.

The block BLK includes, for example, four string units SU0 to SU3. Each string unit SU includes a plurality of NAND strings NS associated with bit lines BL0 to BLm (m is an integer of 1 or more). Each NAND string NS includes, for example, memory cell transistors MC0 to MC15 and select transistors ST1 and ST2. The memory cell transistor MC includes a control gate and a charge storage layer, and stores the data in a nonvolatile way. Each of the select transistors ST1 and ST2 is used for selecting the string unit SU when performing the various operations.

In each NAND string NS, the memory cell transistors MC0 to MC15 are connected in series. A drain of the select transistor ST1 is connected to the associated bit line BL. A source of the select transistor ST1 is connected to one end of the memory cell transistors MC0 to MC15 connected in series. A drain of the select transistor ST2 is connected to the other end of the memory cell transistors MC0 to MC15 connected in series. A source of the select transistor ST2 is connected to the source line SL.

In the same block BLK, the control gates of the memory cell transistors MC0 to MC15 are commonly connected to the word lines WL0 to WL15, respectively. The gates of the respective select transistors ST1 in the string units SU0 to SU3 are commonly connected to the select gate lines SGD0 to SGD3, respectively. The gate of the select transistor ST2 in the same block BLK is commonly connected to the select gate line SGS.

In the configuration of the circuit of the memory cell array 27 described above, the bit line BL is shared by, for example, the NAND string NS to which the same column address is assigned in each string unit SU. The source line SL is shared among, for example, the plurality of blocks BLK.

The set of the plurality of memory cell transistors MC connected to a common word line WL in one string unit SU is referred to as, for example, a cell unit CU. For example, the storage capacity of the cell unit CU that includes the memory cell transistors MC, each of which stores 1 bit data, is defined as "one page". The cell unit CU may have a storage capacity of two pages or more based on the number of bits of data stored in the memory cell transistors MC.

The configuration of the circuit of the memory cell array 27 is not limited to the configuration described above. For example, the number of string units SU in each block BLK and the number of memory cell transistors MC and select transistors ST1 and ST2 in each NAND string NS may be any number, respectively.

[1-1-4] Configuration of Temperature Counter 31

Figure 4:
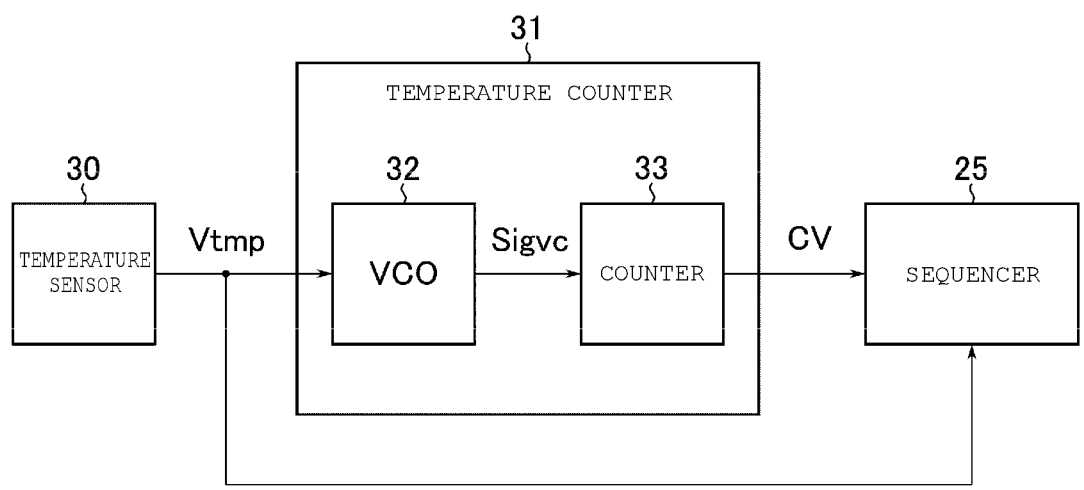
FIG. 4 is a block view showing an example of a configuration of a temperature counter in the memory chip in the memory system according to the first embodiment.

The configuration of the temperature counter 31 in the chip 21 will be described with reference to FIG. 4. FIG. 4 is a block view showing an example of a configuration of the temperature counter 31 in the chip 21 disposed in the memory system 1 according to the present embodiment.

The temperature counter 31 includes, for example, a voltage controlled oscillator (VCO) 32 and a counter 33.

The temperature sensor 30 supplies the temperature-based voltage Vtmp to the sequencer 25 and the VCO 32. The VCO 32 controls an oscillation frequency of a signal Sigvc based on the voltage Vtmp supplied from the temperature sensor 30. For example, as the voltage Vtmp increases, the oscillation frequency of the signal Sigvc increases. The VCO 32 transmits the signal Sigvc to the counter 33.

The counter 33 performs the count-up on the count value CV at a timing based on the period of the signal Sigvc received from the VCO 32. The counter 33 transmits the count value CV to the sequencer 25.

Figure 5:
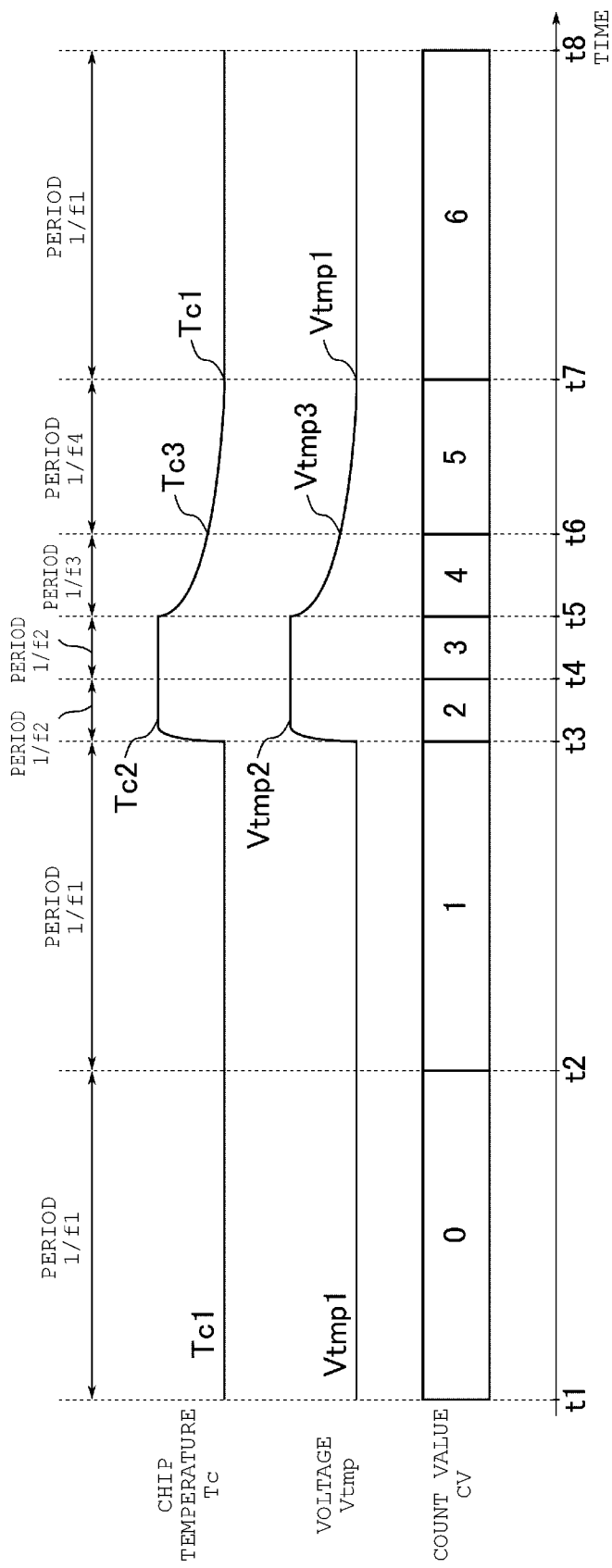
FIG. 5 is a view illustrating a count value of the temperature counter in the memory system according to the first embodiment.

In the following, the count value CV of the temperature counter 31 will be described with reference to FIG. 5. FIG. 5 is a view illustrating the count value CV of the temperature counter 31 in the memory system 1 according to the present embodiment.

When the power supply voltage is supplied to the temperature counter 31 at time t1, the counter 33 sets the count value CV to 0. It is assumed that the chip temperature Tc is Tc1.

When the chip temperature Tc is Tc1, the temperature sensor 30 supplies the voltage Vtmp1 based on the chip temperature Tc1 to the VCO 32. The VCO 32 transmits the signal Sigvc based on the voltage Vtmp1 supplied from the temperature sensor 30 to the counter 33. For example, assuming that the frequency of the signal Sigvc at this time is f1, the period of the signal Sigvc is 1/f1. The counter 33 receives the signal Sigvc from the VCO 32. After the period 1/f1 elapses from the time t1, that is, at time t2, the counter 33 performs the count-up on the count value CV from 0 to 1. After the period 1/f1 elapses from the time t2, that is, at time t3, the counter 33 performs the count-up on the count value CV from 1 to 2.

It is assumed that the chip temperature Tc rises from Tc1 to Tc2 at the time t3. When the chip temperature Tc is Tc2, the temperature sensor 30 supplies the voltage Vtmp2 based on the chip temperature Tc2 to the VCO 32. The VCO 32 transmits the signal Sigvc based on the voltage Vtmp2 supplied from the temperature sensor 30 to the counter 33. For example, assuming that the frequency of the signal Sigvc at this time is f2, there is a relationship of f1<f2. In this case, the period of the signal Sigvc is 1/f2. The period 1/f2 is shorter than the period 1/f1. The counter 33 receives the signal Sigvc from the VCO 32. After the period 1/f2 elapses from the time t3, that is, at time t4, the counter 33 performs the count-up on the count value CV from 2 to 3. After the period 1/f2 elapses from the time t4, that is, at time t5, the counter 33 performs the count-up on the count value CV from 3 to 4.

It is assumed that the chip temperature Tc starts to drop from Tc2 to Tc1 at the time t5. When the chip temperature Tc is between Tc2 and Tc3, which is higher than Tc1, the temperature sensor 30 supplies the voltage Vtmp based on the chip temperature Tc to the VCO 32. The VCO 32 transmits the signal Sigvc based on the voltage Vtmp supplied from the temperature sensor 30 to the counter 33. For example, assuming that the frequency of the signal Sigvc at this time is f3, there is a relationship of f1<f3<f2. In this case, the period of the signal Sigvc is 1/f3. The period 1/f3 is shorter than the period 1/f1 and longer than the period 1/f2. The counter 33 receives the signal Sigvc from the VCO 32. After the period 1/f3 elapses from the time t5, that is, at time t6, the counter 33 performs the count-up on the count value CV from 4 to 5.

It is assumed that the chip temperature Tc reaches Tc3 at the time t6. When the chip temperature Tc is between Tc3 and Tc1, and the temperature sensor 30 supplies the voltage Vtmp based on the chip temperature Tc to the VCO 32, the VCO 32 transmits the signal Sigvc based on the voltage Vtmp supplied from the temperature sensor 30 to the counter 33. For example, assuming that the frequency of the signal Sigvc at this time is f4, there is a relationship of f1<f4<f3. In this case, the period of the signal Sigvc is 1/f4. The period 1/f4 is shorter than the period 1/f1 and longer than the period 1/f3. The counter 33 receives the signal Sigvc from the VCO 32. After the period 1/f4 elapses from the time t6, that is, at time t7, the counter 33 performs the count-up on the count value CV from 5 to 6.

It is assumed that the chip temperature Tc reaches Tc1 at the time t7. Similar to the period from the time t1 to the time t2, after the period 1/f1 elapses from the time t7, that is, at time t8, the counter 33 performs the count-up on the count value CV from 6 to 7.

As described above, the period, in which the counter performs the count-up, becomes longer as the chip temperature drops and becomes shorter as the chip temperature rises. That is, the count-up rate becomes slower as the chip temperature drops, and the count-up rate becomes faster as the chip temperature rises.

[1-1-5] Cumulative Count Value Table 17

The cumulative count value table 17 will be described with reference to FIG. 6. FIG. 6 is a conceptual view of the cumulative count value table 17 in the memory system 1 according to the present embodiment.

The cumulative count value table 17 stores the cumulative count value and a written flag for each word line WL. The cumulative count value is a value indicating the accumulation of count values from when the data is written to the memory cell connected to the corresponding word line WL to when the count value is acquired by the memory controller 10. For example, an initial value of the cumulative count value is set to −1. The written flag is a flag indicating whether or not the data is written to the memory cell connected to the corresponding word line WL. For example, when the data is written to a memory cell connected to the corresponding word line WL, the written flag becomes True. On the other hand, when the data is not written to a memory cell connected to the corresponding word line WL, the written flag becomes False. The initial value of the written flag is set to False. In alternative embodiments, the cumulative count value table 17 may store the cumulative count value and the written flag not for each word line WL but for each of a plurality of word lines or the block BLK, for example.

The cumulative count value table 17 has a plurality of entries (16 in the example in FIG. 6). Each entry includes a word line number, a cumulative count value, and a written flag. The word line numbers correspond to the word lines WL0 to WL15 in FIG. 3.

When the data is not written to the memory cell connected to the corresponding word line WL and when the data erasing is performed for the memory cell connected to the corresponding word line WL, the cumulative count value is set to −1. When the data erasing is performed for a memory cell connected to the corresponding word line WL, the written flag is set to False.

When the data is written to the memory cell connected to the corresponding word line WL and when the refresh operation is performed for the memory cell connected to the corresponding word line WL, the cumulative count value is set to 0.

When performing the refresh reservation control operation, for an entry whose written flag is True, for example, a difference between the previous count value 19 and the count value CV obtained by the temperature counter 31 is added to the cumulative count value.

For example, in the example in FIG. 6, the data is written in the memory cells connected to the word lines WL0 to WL10 of the word line numbers 0 to 10. For the word line numbers 0 to 10, the written flag is True. For the word line numbers 0, 4, and 9, the cumulative count value is 2000. For the word line numbers 1 and 6, the cumulative count value is 2355. For the word line numbers 2 and 7, the cumulative count value is 4336. For the word line numbers 3 and 8, the cumulative count value is 2111. For the word line numbers 5 and 10, the cumulative count value is 335669. On the other hand, the data is not written in the memory cells connected to the word line numbers 11 to 15. For the word line numbers 11 to 15, the written flag is False. For the word line numbers 11 to 15, the cumulative count value is −1.

[1-2] Operation of Memory Controller 10

In the memory system 1 according to the present embodiment, the operations performed by the memory controller 10 include the refresh reservation control operation, the write operation, the read operation, the erasing operation, and the refresh control operation.

Hereinafter, the refresh reservation control operation, the write operation, the erasing operation, and the refresh control operation will be described.

[1-2-1] Refresh Reservation Control Operation

Figure 7:
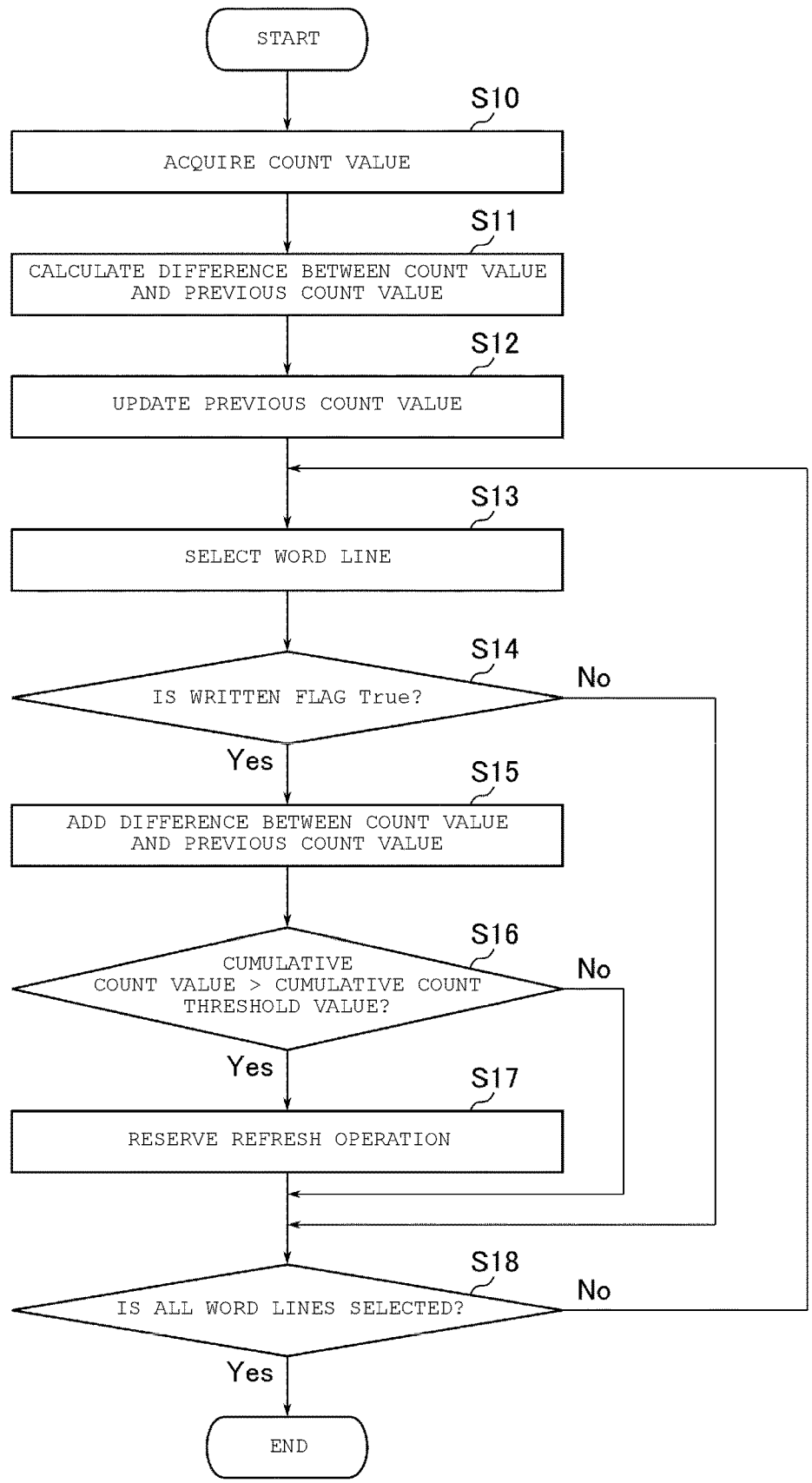
FIG. 7 is a flowchart showing a refresh reservation control operation of a memory controller in the memory system according to the first embodiment.

The refresh reservation control operation will be described with reference to FIG. 7. FIG. 7 is a flowchart showing the refresh reservation control operation of the memory controller 10 in the memory system 1 according to the present embodiment.

The memory controller 10 acquires the count value CV from the temperature counter 31 at a predetermined time interval (for example, one time per day) (S10).

After the count value CV is acquired, the memory controller 10 calculates a difference between the acquired count value CV and the previous count value 19 (S11).

After the difference between the acquired count value CV and the previous count value 19 is calculated, the memory controller 10 updates the previous count value 19 to the count value CV acquired in S10 (S12).

After the previous count value 19 is updated, the memory controller 10 selects the word line WL (S13). In other words, the memory controller 10 selects any word line number in the cumulative count value table 17. In the following, the selected word line WL will be represented as a word line WLsel.

After the word line WLsel is selected, the memory controller 10 determines whether or not the written flag corresponding to the word line WLsel in the cumulative count value table 17 is True (S14).

When it is determined that the corresponding written flag is True (S14_Yes), the memory controller 10 adds the difference between the count value CV calculated in S11 and the previous count value 19 to the cumulative count value corresponding to the word line WLsel in the cumulative count value table 17 (S15).

After the difference between the count value CV and the previous count value 19 is added to the corresponding cumulative count value, the memory controller 10 determines whether or not the cumulative count value corresponding to the word line WLsel in the cumulative count value table 17 exceeds the cumulative count threshold value 18 (S16).

When it is determined that the corresponding cumulative count value exceeds the cumulative count threshold value 18 (S16_Yes), the memory controller 10 reserves the refresh operation (S17).

After the refresh operation is reserved, the memory controller 10 determines whether or not all the word lines WL are selected (S18).

When it is determined that all the word lines WL are selected (S18_Yes), the memory controller 10 ends the refresh reservation control operation.

On the other hand, when it is determined that all the word lines WL are not selected (S18_No), the memory controller 10 executes the above-mentioned S13.

When it is determined that the corresponding written flag is not True (S14_No), and when it is determined that the corresponding cumulative count value does not exceed the cumulative count threshold value 18 (S16_No), the memory controller 10 executes the above-mentioned S18.

As described above, the memory controller 10 executes (repeats) the above-mentioned S13 to S17 for each entry in the cumulative count value table 17. For example, when the entry in the cumulative count value table 17 is defined for each of the plurality of word lines or each of the blocks BLK, the above-mentioned S13 to S17 are executed in units of the plurality of word lines WL or unit of the block.

Figure 8:
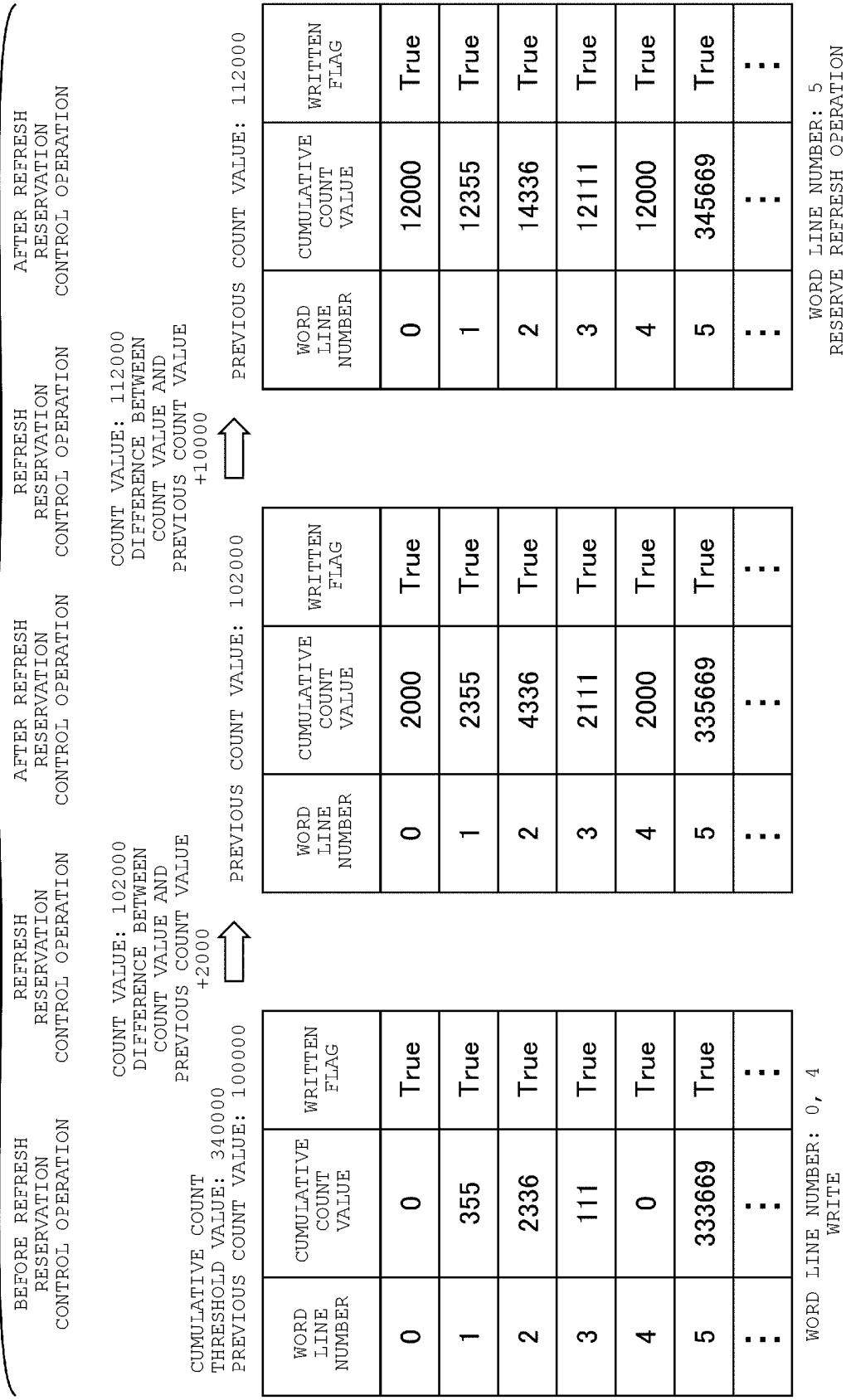
FIG. 8 is a view illustrating the refresh reservation control operation of the memory controller in the memory system according to the first embodiment.

Hereinafter, a specific example of the refresh reservation control operation will be described with reference to FIG. 8. FIG. 8 is a view illustrating the refresh reservation control operation of the memory controller 10 in the memory system 1 according to the present embodiment. FIG. 8 shows six entries in the cumulative count value table 17 for the sake of simplicity.

The table on the left shows the cumulative count value table 17 before the refresh reservation control operation is performed. It is assumed that the cumulative count threshold value 18 is 340000. It is assumed that the previous count value 19 is 100000. Since the data is written to the memory cells connected to the word lines WL0 and WL4, the cumulative count values corresponding to the word line numbers 0 and 4 are changed from −1 to 0. The data is written in the memory cells connected to the word lines WL1 to WL3 and WL5. It is assumed that the cumulative count value corresponding to the word line number 1 is 355. It is assumed that the cumulative count value corresponding to the word line number 2 is 2336. It is assumed that the cumulative count value corresponding to the word line number 3 is 111. It is assumed that the cumulative count value corresponding to the word line number 5 is 333669. The written flags corresponding to the word line numbers 0 to 5 are True. The central table shows the cumulative count value table 17 after the refresh reservation control operation is performed. The table on the right shows the cumulative count value table 17 after a certain period of time elapsed since the refresh reservation control operation was performed and after the next refresh reservation control operation is performed.

In the refresh reservation control operation, the following operations are performed.

The memory controller 10 acquires the count value CV (102000) from the temperature counter 31 (S10 in FIG. 7).

The memory controller 10 calculates a difference (2000) between the acquired count value CV (102000) and the previous count value 19 (100000) (S11 in FIG. 7).

After the difference between the count value CV and the previous count value 19 is calculated, the memory controller 10 updates the previous count value 19 to the count value CV (102000) acquired in S10 in FIG. 7 (S12 in FIG. 7).

The memory controller 10 adds the difference (2000) between the count value CV calculated in S11 in FIG. 7 and the previous count value 19 to the cumulative count value for each entry in the cumulative count value table 17 where the written flag is True (S15 in FIG. 7). The cumulative count values corresponding to the word line numbers 0 and 4 become 2000 from 0. The cumulative count value corresponding to the word line number 1 becomes 2355 from 355. The cumulative count value corresponding to the word line number 2 becomes 4336 from 2336. The cumulative count value corresponding to the word line number 3 becomes 2111 from 111. The cumulative count value corresponding to the word line number 5 becomes 335669 from 333669.

The memory controller 10 determines whether or not the cumulative count value exceeds the cumulative count threshold value 18 (340000) for each entry corresponding to the word line numbers 0 to 5 in the cumulative count value table 17 (S16 in FIG. 7). The cumulative count values corresponding to the word line numbers 0 to 5 do not exceed the cumulative count threshold value 18 (340000). Therefore, the memory controller 10 does not reserve the refresh operation.

In the next refresh reservation control operation, the following operations are performed.

The memory controller 10 acquires the count value CV (112000) from the temperature counter 31 (S10 in FIG. 7).

The memory controller 10 calculates a difference (10000) between the acquired count value CV (112000) and the previous count value 19 (102000) (S11 in FIG. 7).

After the difference between the count value CV and the previous count value 19 is calculated, the memory controller 10 updates the previous count value 19 to the count value CV (112000) acquired in S10 in FIG. 7 (S12 in FIG. 7).

The memory controller 10 adds the difference (10000) between the count value CV calculated in S11 in FIG. 7 and the previous count value 19 to the cumulative count value for each entry in the cumulative count value table 17 where the written flag is True (S15 in FIG. 7). The cumulative count values corresponding to the word line numbers 0 and 4 become 12000 from 2000. The cumulative count value corresponding to the word line number 1 becomes 12355 from 2355. The cumulative count value corresponding to the word line number 2 becomes 14336 from 4336. The cumulative count value corresponding to the word line number 3 becomes 12111 from 2111. The cumulative count value corresponding to the word line number 5 becomes 345669 from 335669.

The memory controller 10 determines whether or not the cumulative count value exceeds the cumulative count threshold value 18 (340000) for each entry corresponding to the word line numbers 0 to 5 in the cumulative count value table 17 (S16 in FIG. 7). The cumulative count values corresponding to the word line numbers 0 to 4 do not exceed the cumulative count threshold value (340000). However, the cumulative count value (345669) corresponding to the word line number 5 exceeds the cumulative count threshold value (340000). Therefore, the memory controller 10 reserves a refresh operation for the memory cell connected to the word line WL5.

[1-2-2] Write Operation

Figure 9:
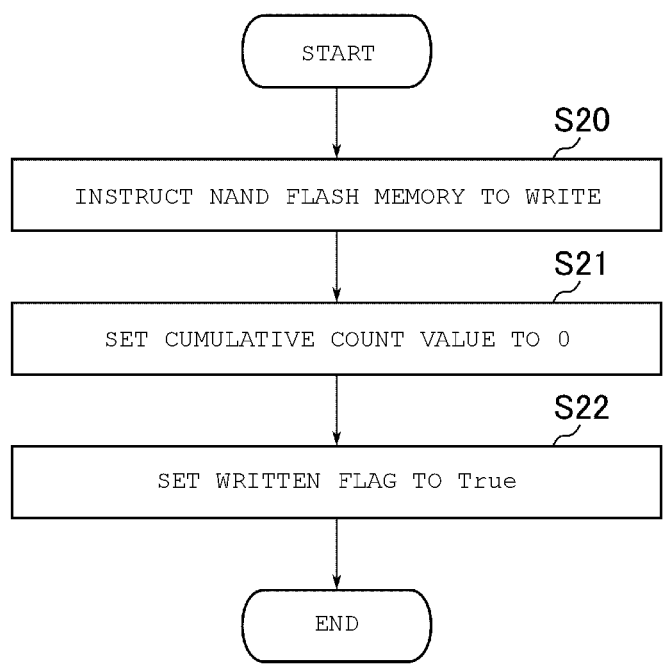
FIG. 9 is a flowchart showing a write operation of the memory controller in the memory system according to the first embodiment.

The write operation will be described with reference to FIG. 9. FIG. 9 is a flowchart showing the write operation of the memory controller 10 in the memory system 1 according to the present embodiment.

When the write request from the host device 2 is received, the memory controller 10 instructs the NAND flash memory 20 to write the data (S20).

When the NAND flash memory 20 completes writing the data, the memory controller 10 sets (clears) the cumulative count value corresponding to the word line WLsel in the cumulative count value table 17 to 0 (S21). Further, the memory controller 10 sets the written flag corresponding to the word line WLsel in the cumulative count value table 17 to True (S22).

[1-2-3] Erasing Operation

Figure 10:
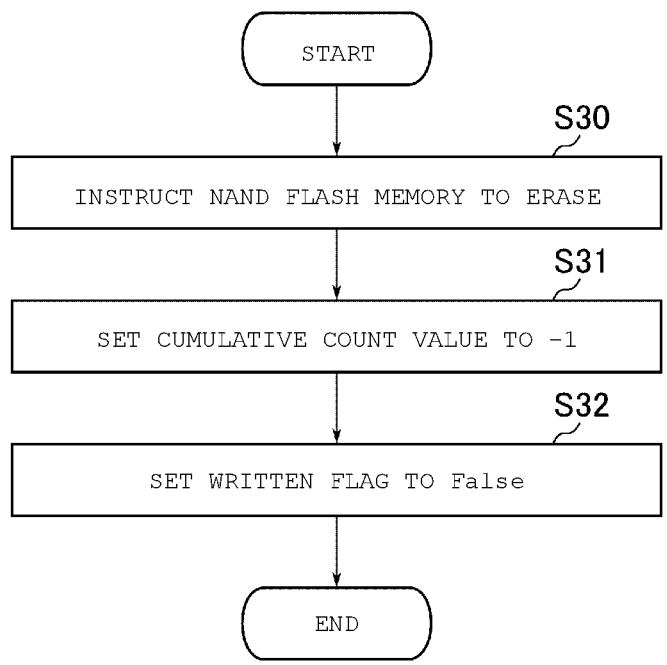
FIG. 10 is a flowchart showing an erasing operation of the memory controller in the memory system according to the first embodiment.

The erasing operation will be described with reference to FIG. 10. FIG. 10 is a flowchart showing the erasing operation of the memory controller 10 in the memory system 1 according to the present embodiment.

The memory controller 10 instructs the NAND flash memory 20 to erase the data (S30).

When the NAND flash memory 20 completes erasing the data, the memory controller 10 sets (initializes) the cumulative count value corresponding to the word line WLsel in the cumulative count value table 17 to −1 (S31). Further, the memory controller 10 sets the written flag corresponding to the word line WLsel in the cumulative count value table 17 to False (S32).

[1-2-4] Refresh Control Operation

Figure 11:
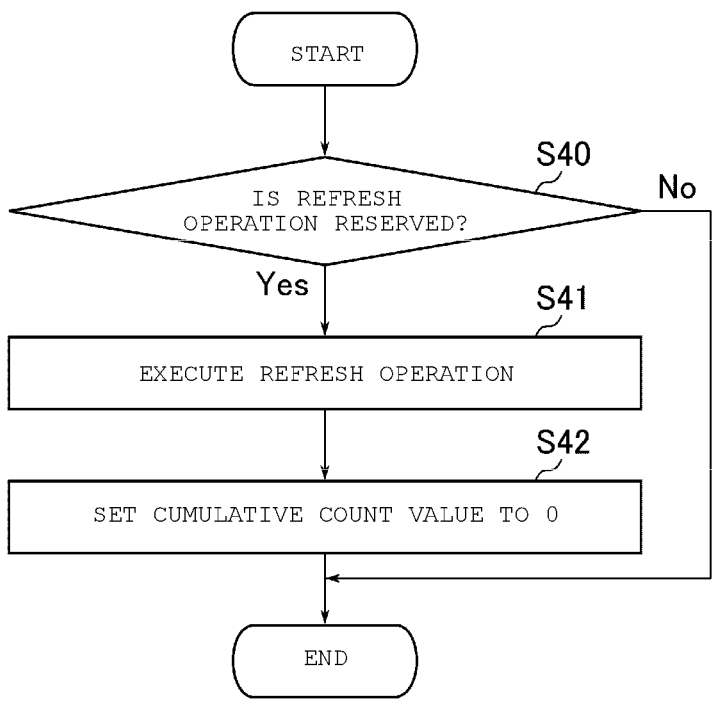
FIG. 11 is a flowchart showing a refresh control operation of the memory controller in the memory system according to the first embodiment.

The refresh control operation will be described with reference to FIG. 11. FIG. 11 is a flowchart showing the refresh control operation of the memory controller 10 in the memory system 1 according to the present embodiment.

At a predetermined time interval, the memory controller 10 checks whether or not the refresh operation is reserved (S40).

When it is checked that the refresh operation is reserved (S40 Yes), the memory controller 10 executes the refresh operation (S41).

When the refresh operation is ended, the memory controller 10 sets (clears) the cumulative count value corresponding to the word line WLsel in the cumulative count value table 17 to 0 (S42).

On the other hand, when it is checked that the refresh operation is not reserved (S40 No), the memory controller 10 ends the refresh control operation.

[1-3] Effect

In the configuration according to the present embodiment, the NAND flash memory 20 includes a temperature counter 31. The temperature counter 31 changes the period (rate) of the count-up based on the voltage supplied from the temperature sensor 30. The count value CV of the temperature counter 31 corresponds to the temperature history of the chip 21. The memory controller 10 stores the cumulative count value table 17. The memory controller 10 acquires the count value CV from the temperature counter at the predetermined time interval. The memory controller 10 updates the cumulative count value in the cumulative count value table 17 based on the acquired count value CV. The memory controller 10 reserves the refresh operation when the updated cumulative count value exceeds the cumulative count threshold value 18.

As described above, according to the present embodiment, the memory controller 10 can know the temperature history of the chip 21 by the count value CV. That is, the memory controller 10 can obtain the temperature history during the period when the temperature of the chip 21 is not monitored. Therefore, the memory controller 10 does not have to monitor the temperature of the chip 21 with high frequency, so that the low power consumption can be achieved. Further, since the time devoted to the monitor can be reduced, the processing capability of the memory controller 10 can be improved.

Further, according to the present embodiment, since the memory controller 10 can reserve the refresh operation by reflecting the temperature history of the chip 21 during the non-monitoring period, it is possible to reduce erroneous reading due to loss of data retention. Therefore, the reliability of the data can be improved.

[2] Second Embodiment

The second embodiment will be described. In the memory system 1 according to the present embodiment, the configuration of the chip 21 and the configuration of the temperature counter 31 are different from those of the first embodiment. The operation of the memory controller 10 is the same as that of the first embodiment. In the following, elements different from the first embodiment will be mainly described.

[2-1] Configuration of Chips 21

Figure 12:
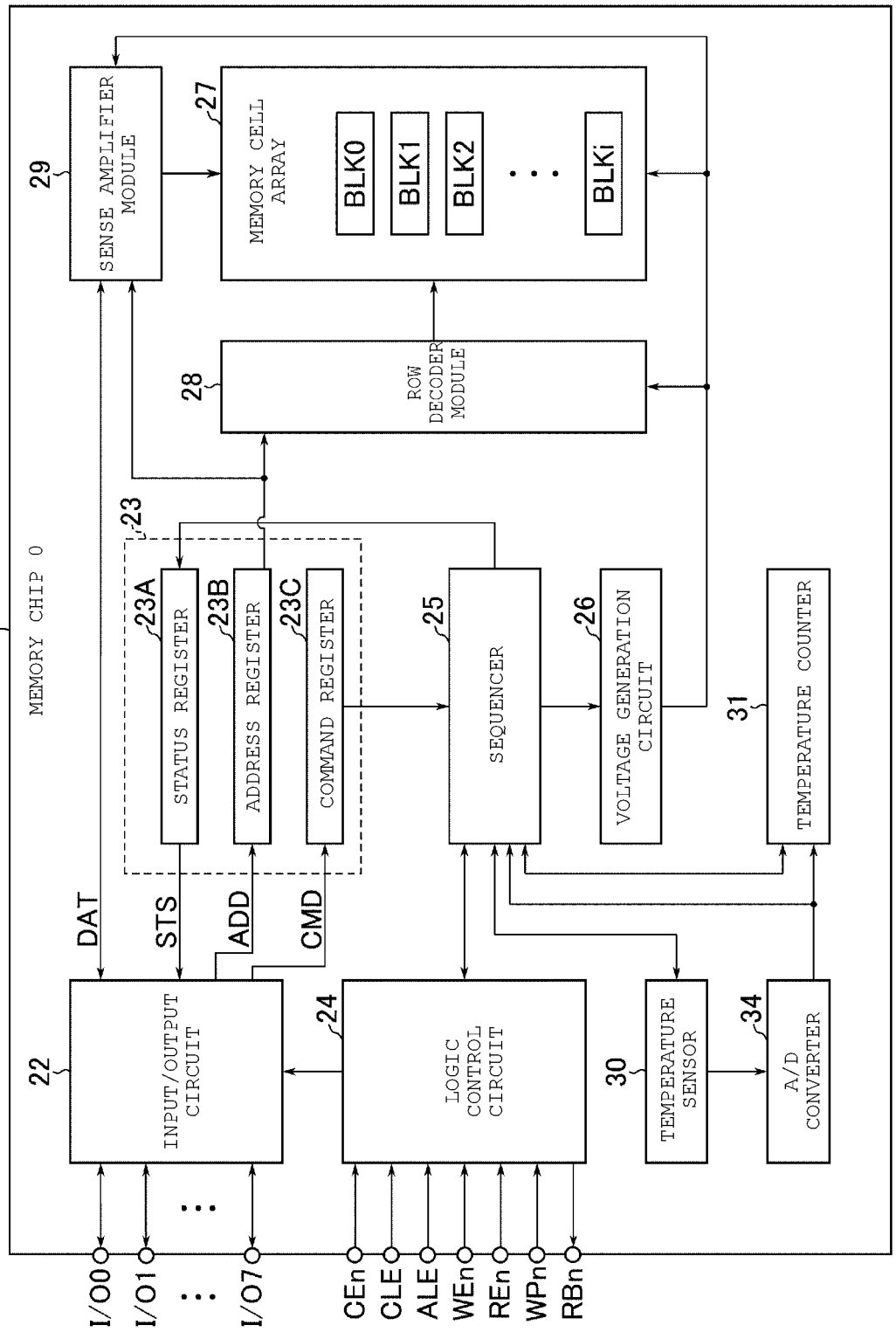
FIG. 12 is a block view showing an example of a configuration of a memory chip in a semiconductor storage device in a memory system according to a second embodiment.

The configuration of the chip 21 in the NAND flash memory 20 will be described with reference to FIG. 12. FIG. 12 is a block view showing an example of a configuration of a chip 21-0 in the NAND flash memory 20 disposed in the memory system 1 according to the present embodiment. Since the chips 21-1 to 21-N have the same configuration as the chip 21-0, the description thereof will be omitted.

The chip 21-0 further includes an A/D converter 34. Other configurations of the chip 21-0 are equivalent to those of the first embodiment.

The A/D converter 34 A/D converts the voltage supplied from the temperature sensor 30. The A/D converter 34 transmits the A/D converted value to the sequencer 25 and the temperature counter 31.

[2-2] Configuration of Temperature Counter 31

Figure 13:
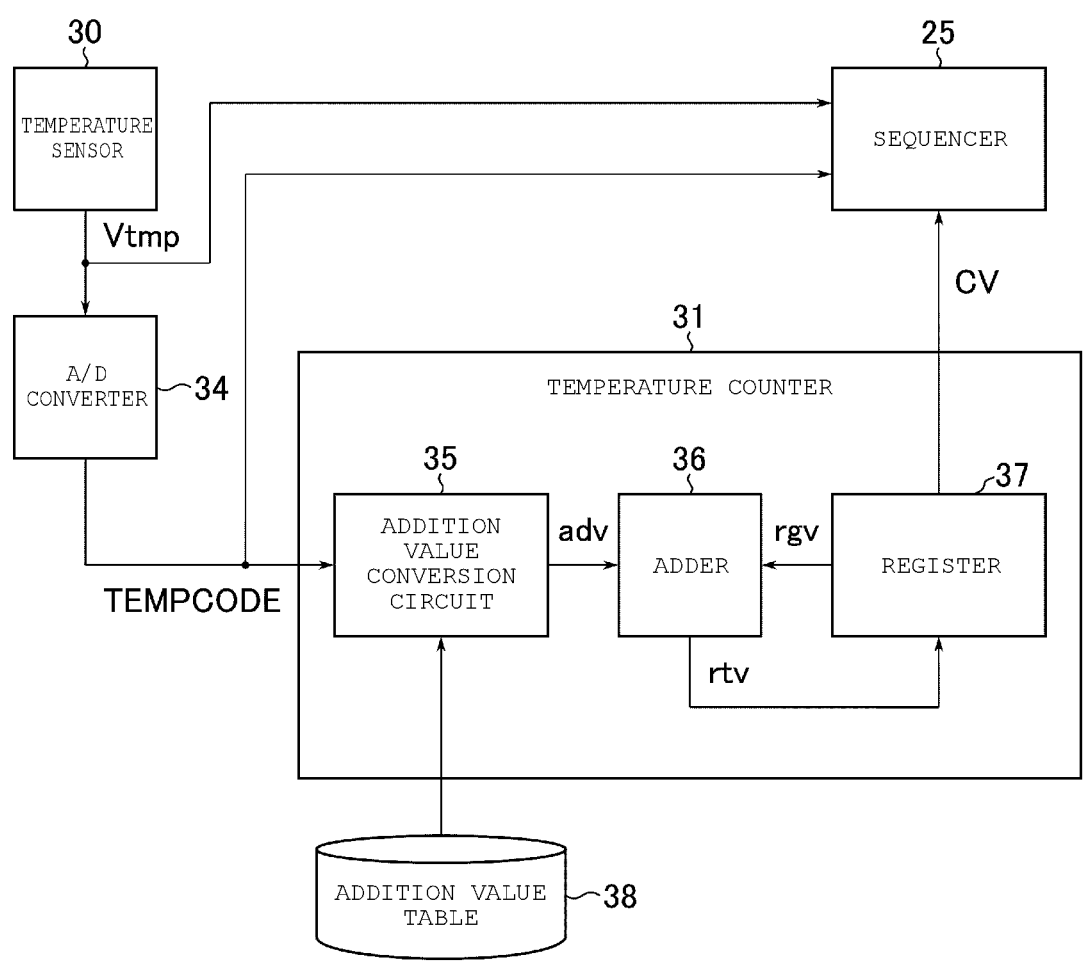
FIG. 13 is a block view showing an example of a configuration of a temperature counter in the memory chip in the memory system according to the second embodiment.

The configuration of the temperature counter 31 in the chip 21 will be described with reference to FIG. 13. FIG. 13 is a block view showing an example of a configuration of the temperature counter 31 in the chip 21 disposed in the memory system 1 according to the present embodiment.

The temperature counter 31 changes the amount of count-up (update of the count value) based on the value received from the A/D converter 34. For example, the temperature counter 31 increases the amount of one time count-up as the value received from the A/D converter 34 increases. The temperature counter 31 includes, for example, an addition value conversion circuit 35, an adder 36, and a register 37.

The temperature sensor 30 supplies a temperature-based voltage Vtmp to the sequencer 25 and the A/D converter 34. The A/D converter 34 transmits the A/D converted value of the voltage Vtmp supplied from the temperature sensor 30 to the sequencer 25 and the addition value conversion circuit 35 as a temperature code TEMPCODE.

The addition value conversion circuit 35 receives the temperature code TEMPCODE from the A/D converter 34 at a predetermined time interval (for example, one time per second). The addition value conversion circuit 35 acquires an addition value table 38 stored in the NAND flash memory 20. The addition value table 38 is a table in which the addition value is stored. The addition value is the amount of one-time count-up corresponding to the temperature code TEMPCODE. The details of the addition value table 38 will be described later. The addition value conversion circuit 35 converts the received temperature code TEMPCODE into the addition value adv based on the addition value table 38. The addition value conversion circuit 35 transmits the addition value adv to the adder 36.

The adder 36 receives the addition value adv from the addition value conversion circuit 35. The adder 36 receives a value rgv stored in the register 37 from the register 37. The adder 36 adds the addition value adv received from the addition value conversion circuit 35 to the value rgv received from the register 37. The adder 36 transmits an addition result (value rtv) to the register 37.

The register 37 stores the value rtv received from the adder 36 as the value rgv. The register 37 transmits the stored value rgv to the adder 36. The register 37 transmits the stored value rgv as the count value CV to the sequencer 25.

[2-3] Addition Value Table 38

The addition value table 38 will be described with reference to FIG. 14. FIG. 14 is a conceptual view of the addition value table 38 in the memory system 1 according to the present embodiment.

The addition value table 38 stores the addition value for each temperature code TEMPCODE.

The addition value table 38 has a plurality of entries (11 in the example in FIG. 14). Each entry includes the temperature code TEMPCODE and the addition value. The temperature code TEMPCODE is a value corresponding to the temperature. The addition value table 38 is stored in, for example, any block BLK of the NAND flash memory 20. The addition value table 38 is loaded from the NAND flash memory 20 into a RAM (not shown) immediately after the power is turned on, for example.

For example, in the example in FIG. 14, the numerical value of the temperature code TEMPCODE is represented by the temperature [degrees] of the chip 21. That is, in FIG. 14, the addition value is defined every 10 degrees from 20 degrees to 120 degrees. The addition values corresponding to 20 degrees, 30 degrees, 40 degrees, and 50 degrees are 1. The addition value corresponding to 60 degrees is 2. The addition value corresponding to 70 degrees is 4. The addition value corresponding to 80 degrees is 8. The addition value corresponding to 90 degrees is 16. The addition value corresponding to 100 degrees is 32. The addition value corresponding to 110 degrees is 128. The addition value corresponding to 120 degrees is 256. The addition value corresponding to the temperature of the chip 21 is not limited to this.

When the temperature of the chip 21 is less than 60 degrees, the addition value conversion circuit 35 converts the temperature code TEMPCODE into the addition value (1). The adder 36 adds the addition value (1) received from the addition value conversion circuit 35 to the value stored in the register 37.

When the temperature of the chip 21 is 60 degrees or more and less than 70 degrees, the addition value conversion circuit 35 converts the temperature code TEMPCODE into the addition value (2). The adder 36 adds the addition value (2) received from the addition value conversion circuit 35 to the value stored in the register 37.

When the temperature of the chip 21 is 70 degrees or more and less than 80 degrees, the addition value conversion circuit 35 converts the temperature code TEMPCODE into the addition value (4). The adder 36 adds the addition value (4) received from the addition value conversion circuit 35 to the value stored in the register 37.

When the temperature of the chip 21 is 80 degrees or more and less than 90 degrees, the addition value conversion circuit 35 converts the temperature code TEMPCODE into the addition value (8). The adder 36 adds the addition value (8) received from the addition value conversion circuit 35 to the value stored in the register 37.

When the temperature of the chip 21 is 90 degrees or more and less than 100 degrees, the addition value conversion circuit 35 converts the temperature code TEMPCODE into the addition value (16). The adder 36 adds the addition value (16) received from the addition value conversion circuit 35 to the value stored in the register 37.

When the temperature of the chip 21 is 100 degrees or more and less than 110 degrees, the addition value conversion circuit 35 converts the temperature code TEMPCODE into the addition value (32). The adder 36 adds the addition value (32) received from the addition value conversion circuit 35 to the value stored in the register 37.

When the temperature of the chip 21 is 110 degrees or more and less than 120 degrees, the addition value conversion circuit 35 converts the temperature code TEMPCODE into the addition value (128). The adder 36 adds the addition value (128) received from the addition value conversion circuit 35 to the value stored in the register 37.

When the temperature of the chip 21 is 120 degrees or higher, the addition value conversion circuit 35 converts the temperature code TEMPCODE into the addition value (256). The adder 36 adds the addition value (256) received from the addition value conversion circuit 35 to the value stored in the register 37.

As described above, the amount of the temperature counter 31 counting up at one time becomes smaller as the chip temperature drops and becomes larger as the chip temperature rises. That is, the count-up rate becomes slower as the chip temperature drops, and the count-up rate becomes faster as the chip temperature rises.

[2-4] Effect

According to the configuration of the present embodiment, the same effect as that of the first embodiment is obtained.

[3] Modification Examples

As described above, a memory system according to the embodiment includes: a semiconductor storage device (20) including a memory cell array (27) that includes memory cells (MC), and a temperature counter (31) that changes a rate at which a count value (CV) is updated based on a temperature of the memory cell array; and a memory controller (10) configured to acquire the count value from the semiconductor storage device, and reserve a refresh operation for the memory cell when a cumulative value of the count value, which is accumulated from when data is written to the memory cell to when the count value is acquired, exceeds a predetermined value (18).

The embodiment is not limited to the above-described form, and various modifications can be made.

Further, in the flowchart described in the above embodiment, the order of the processes can be changed as much as possible. For example, in the refresh reservation control operation, the update of the previous count value (S12) may be executed after determining whether or not all the word lines WL are selected (S18). In the write operation, the order of updating the cumulative count value to 0 (S21) and updating the written flag to True (S22) may be reversed. In the erasing operation, the order of updating the cumulative count value to −1 (S31) and updating the written flag to False (S32) may be reversed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a semiconductor storage device including
a memory cell array that includes memory cells, and
a temperature counter configured to increase a count value thereof at a rate that depends on a temperature of the memory cell array; and
a memory controller configured to
acquire the count value from the semiconductor storage device, and
reserve a refresh operation for a written memory cell of the memory cell array when a cumulative value of the count value, which is accumulated from when data was written to the written memory cell to when the count value is acquired, exceeds a predetermined value.

2. The memory system according to claim 1, wherein the temperature counter is configured to change a period of incrementing the count value based on the temperature.

3. The memory system according to claim 2, wherein the period of incrementing the count value is increased as the temperature drops and decreased as the temperature rises.

4. The memory system according to claim 1, wherein the temperature counter is configured to change an amount of increase in the count value per update based on the temperature.

5. The memory system according to claim 4, wherein the amount of increase in the count value per update is decreased as the temperature drops and increased as the temperature rises.

6. The memory system according to claim 5, wherein the amount of increase in the count value per update is predetermined for each of a plurality of different temperature ranges.

7. The memory system according to claim 1,
wherein the memory controller is configured to clear the cumulative value of the count value corresponding to the written memory cell when data was written to the written memory cell.

8. The memory system according to claim 1,
wherein the memory controller is configured to execute the refresh operation for the written memory cell for which the refresh operation has been reserved.

9. The memory system according to claim 8,
wherein the memory controller is configured to clear the cumulative value of the count value corresponding to the written memory cell when the refresh operation is executed for the written memory cell.

10. The memory system according to claim 9,
wherein the count value corresponding to the written memory cell is a count value corresponding to a page of memory cells including the written memory cell, and the refresh operation is executed for the page of memory cells including the written memory cell when the refresh operation is executed for the written memory cell.

11. A memory controller configured to:
acquire a count value that is updated based on a temperature of a memory cell array from a semiconductor storage device that has the memory cell array including memory cells; and
reserve a refresh operation for a written memory cell of the memory cell array when a cumulative value of the count value, which is accumulated from when data was written to the written memory cell to when the count value is acquired, exceeds a predetermined value.

12. The memory controller according to claim 10, further configured to:
clear the cumulative value of the count value corresponding to the written memory cell when data was written to the written memory cell.

13. The memory controller according to claim 11, further configured to:
execute the refresh operation for the written memory cell for which the refresh operation has been reserved.

14. The memory controller according to claim 13, further configured to:
clear the cumulative value of the count value corresponding to the written memory cell when the refresh operation is executed for the written memory cell.

15. A semiconductor storage device comprising:
a memory cell array that includes memory cells; and
a temperature counter configured to increase a count value thereof at a rate that depends on a temperature of the memory cell array.

16. The semiconductor storage device according to claim 15,
wherein the temperature counter is configured to change a period of incrementing the count value based on the temperature.

17. The semiconductor storage device according to claim 16,
wherein the period of incrementing the count value is increased as the temperature drops and decreased as the temperature rises.

18. The semiconductor storage device according to claim 16,
wherein the temperature counter is configured to change an amount of increase in the count value per update based on the temperature.

19. The semiconductor storage device according to claim 18,
wherein the amount of increase in the count value per update is decreased as the temperature drops and increased as the temperature rises.

20. The semiconductor storage device according to claim 19,
wherein the amount of increase in the count value per update is predetermined for each of a plurality of different temperature ranges.

* * * * *